United States Patent [19]

Higgins et al.

[11] Patent Number: 5,373,261
[45] Date of Patent: Dec. 13, 1994

[54] DIRECT OPTICAL INJECTION LOCKED FET OSCILLATOR

[75] Inventors: Thomas P. Higgins; Dana J. Sturzebecher, both of Tinton Falls; Arthur Paolella, Howell, all of N.J.

[73] Assignee: The United States of America as represented by the Secretary of the Army, Washington, D.C.

[21] Appl. No.: 981,658

[22] Filed: Jan. 21, 1993

[51] Int. Cl.⁵ .............. H03B 5/08; H03B 5/12; H03B 5/18; G02B 6/36
[52] U.S. Cl. .............. 331/66; 257/432; 385/39; 385/49; 385/51; 331/172
[58] Field of Search .............. 331/66, 55, 172; 385/33, 39, 40, 49, 51, 31; 257/225, 257, 290, 294, 432, 436, 437, 466, 687, 433, 434

[56] References Cited

U.S. PATENT DOCUMENTS

| | | | |
|---|---|---|---|
| 3,864,019 | 2/1975 | Smolinsky et al. | 385/49 |
| 4,182,545 | 1/1980 | Greer | 385/49 X |
| 4,601,535 | 7/1986 | Tanaka et al. | 385/31 |
| 4,790,620 | 12/1988 | Niwayama | 385/49 X |
| 4,826,272 | 5/1989 | Pimpinella et al. | 257/432 X |
| 4,961,801 | 10/1990 | Gasparian | 385/49 X |

FOREIGN PATENT DOCUMENTS 6091482  7/1981  Japan .................. 257/432

OTHER PUBLICATIONS

D. C. Buck and M. A. Cross; "Optical Injection Locking of FET Oscillators Using Fiber Optics"; Digest of Papers, *IEEE MTT Symposium, 1986.* pp. 611-614.

Ronald D. Esman, Lew Goldberg and J. F. Weller; "Optical Phase Control of an Optically Injection-Locked FET Microwave Oscillator", *IEEE Transactions On Microwave Theory and Techniques,* vol. 37, No. 10, Oct. 1989. pp. 1512-1518.

Alwyn J. Seeds and Augustor A. De Salles; "Optical Control of Microwave Semiconductor Devices", *IEEE Transactions On Microwave Theory and Techniques,* vol. 38, No. 5, May 1990. pp. 577-584.

*Primary Examiner*—David Mis
*Attorney, Agent, or Firm*—Michael Zelenka; William H. Anderson

[57] ABSTRACT

The coupling of optical signals to the active region of a FET having a wide source to drain spacing via an optical fiber and material having an index of refraction matching that of the fiber or the FET so as to increase the locking range when the FET is part of an oscillator circuit or to increase the change in the electrical gain of the FET caused by a change in the optical energy if the FET is an amplifier.

10 Claims, 4 Drawing Sheets

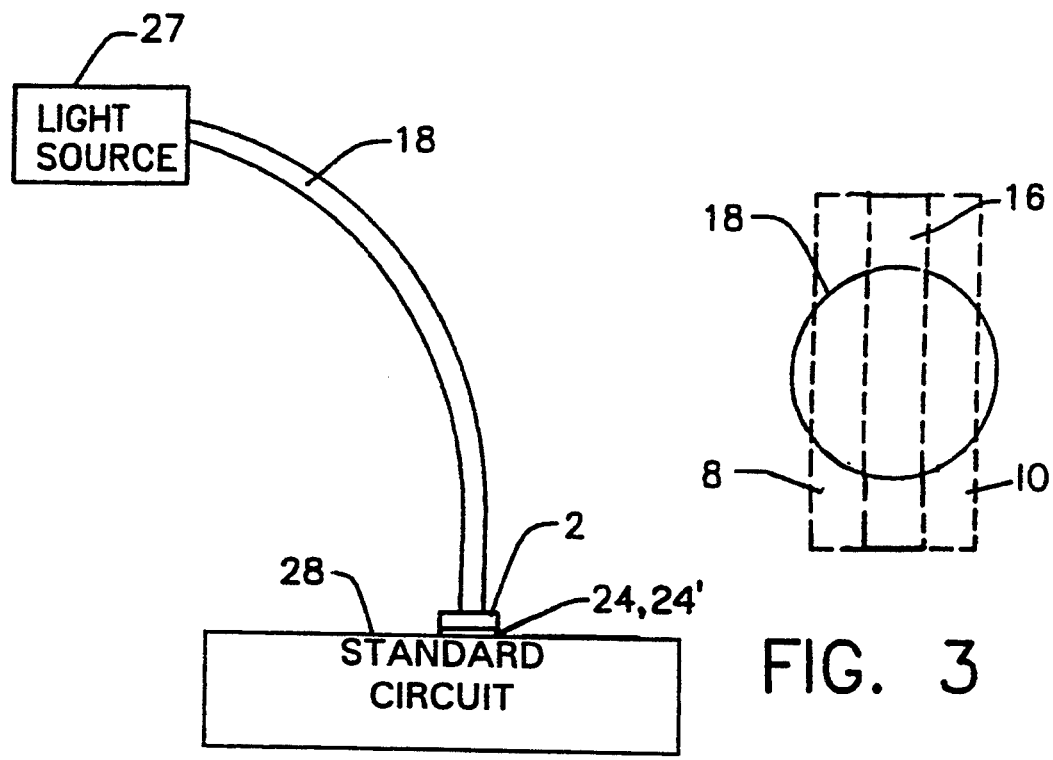
FIG. 2
FIG. 3
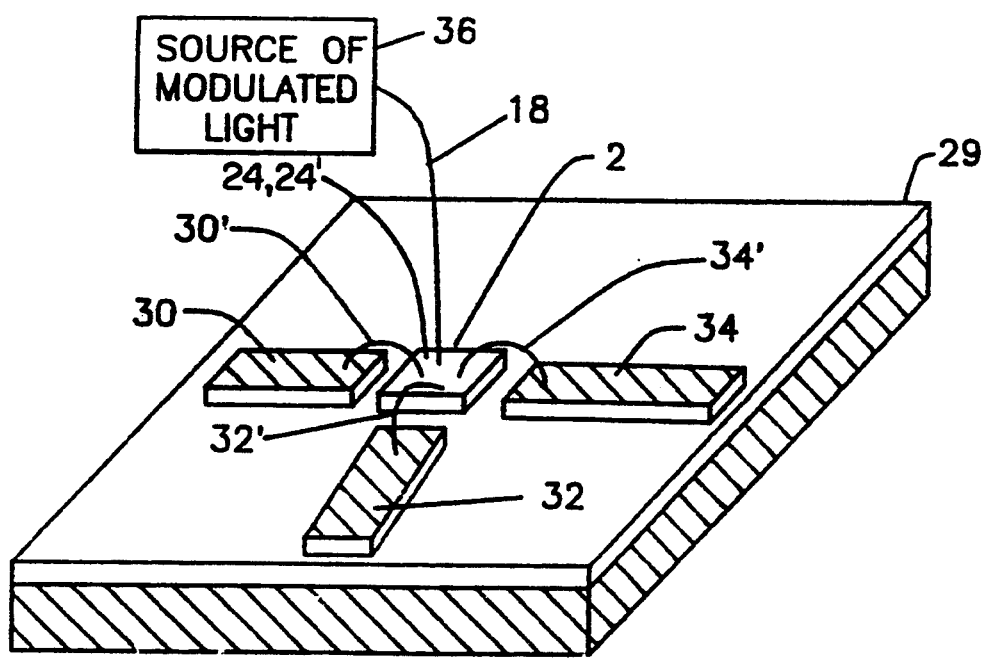
FIG. 4

DIRECT OPTICAL INJECTION LOCKED FET OSCILLATOR

GOVERNMENT INTEREST

The invention described herein may be manufactured, used, and licensed by or for the Government of the United States of America for governmental purposes without the payment to us of any royalty thereon.

FIELD OF THE INVENTION

This invention is in the field of microwave circuits and fiber optics.

BACKGROUND OF THE INVENTION

Description of the Prior Art

It is known that the frequency of an oscillator having a field effect transistor, FET, as its active element can be locked to the frequency of variations in the intensity of light in an optical signal injected into the active region of the FET that lies between its source and drain electrodes. For any given amount of modulated light intensity, there is a given bandwidth of frequencies, $\Delta f$, called the locking bandwidth, to which the oscillator can be locked. Whereas the locking bandwidth can be increased by increasing the peak modulated light intensity, a limit is reached when the active region of the FET becomes saturated. At the present time, the highest ratio of the locking bandwidth, $\Delta f$, to the free running frequency of an oscillator being locked is about 0.2%. Thus, in a situation where a large number of oscillators are to be locked to the same optical signal, it is essential that their free running frequencies be within $\Delta f$ of the frequency of the optical signal for locking to occur. Unfortunately, however, this can be very expensive to obtain.

In an article entitled "Optical Injection Locking of FET Oscillators Using Fiber Optics", by D. C. Buck and M. A. Cross, that was published in a "Digest of Papers" for the *IEEE MTT Symposium of* 1986, a locking bandwidth of 5 MHz for an oscillator in the S band was said to have been achieved by injecting the optical signal into a FET via an optical fiber. This was achieved by using a lens to transform the cylindrical beam emerging from the fiber into an elliptical beam having its major axis aligned with length of the long narrow space between the source and drain electrodes of the FET.

In an article entitled "Optical Phase Control of an Optically Injection-Locked FET Microwave Oscillator", by Ronald D. Esman, Lew Goldberg and J. F. Weller, that was published in Vol. 37, No. 10 of the *IEEE Transactions On Microwave Theory and Techniques* of October, 1989, lock-in ranges that are a small fraction of 1% are reported. Also described are two ways of improving the coupling of optical energy to a FET. In one, the passivation layer is made to be antireflective, but the optical signal is shown as passing through space. In the other, an optical fiber is inserted through the substrate into contact with the active region of the FET, but this requires special construction not found in FET's available on the market.

BRIEF SUMMARY OF THE INVENTION

In accordance with this invention, a five fold increase is obtained in the lock-in range of a FET oscillator by choosing a FET having a wider than usual separation between the source and drain electrodes and coupling the optical signal to the body of the FET on the same side as the electrodes with an optical fiber. Coupling efficiency is increased by using material between the end of the fiber and the FET having an index of refraction matching that of the fiber or the FET, preferably the former. The material can be liquid in which event means are provided for physically holding the fiber against the FET or it can be an adhesive in which event no holding means is required.

BRIEF DESCRIPTION OF THE DRAWINGS

Various embodiments of the present invention are described below with reference to the drawings, in which like items are identified by the same reference designation, and in which:

FIG. 2 is a side view of the coupling of this invention between a source of modulated light and a FET:

FIG. 3 is a top view of the coupling of an optical fiber to a FET in accordance with this invention showing the relationship between the shape and size of the active region of a FET used in this invention and the shape and size of the cross section of an optical fiber;

FIG. 4 is an oblique view of the coupling of this invention between a source of modulated light and an FET oscillator;

DETAILED DESCRIPTION OF THE DRAWINGS

Figure 1A:
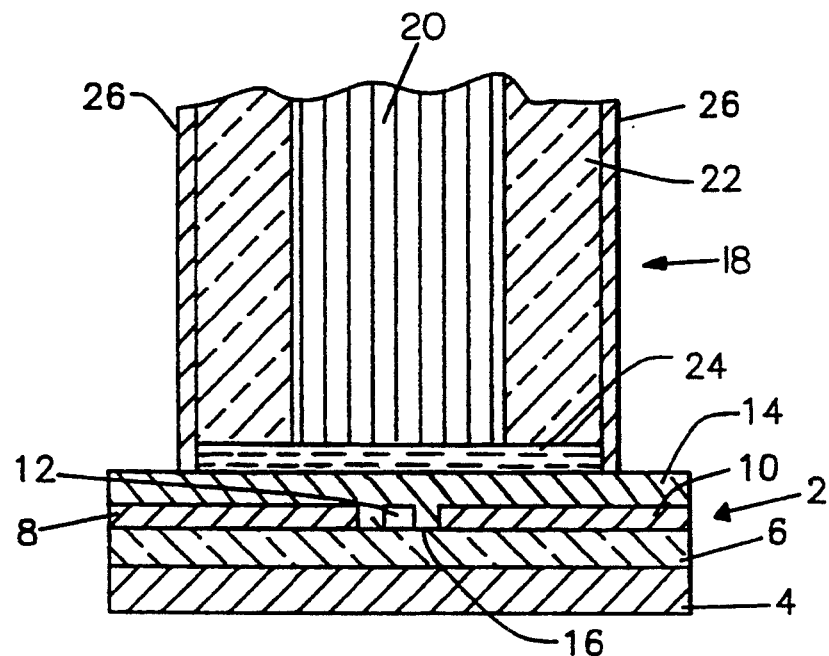
FIG. 1A is a cross section illustrating the coupling between an optical fiber and the body of a FET via index matching liquid in accordance with this invention.

In the cross sectional view of FIG. 1A, the body of a FET 2 is shown as being comprised of a substrate 4, a channel 6 between the substrate 4 and source, drain and gate electrodes 8, 10 and 12, respectively. It is also customary to have a passivation layer 14 superimposed on the electrodes 8, 10 and 12. In such a device there is an active region 16 in the channel 6 between the source electrode 8 and the drain electrode 12 that is affected by the injection of light therein. In accordance with one aspect of this invention, a FET such as the GTC 213-1 made by ITT is used in which the separation between the parallel source and drain electrodes 8 and 10 is 8 um and greater than the usual separation so as to increase the width of the active region 16.

Light can be injected into the active region 16 in a number of ways, but in accordance with this invention, it is conducted to the active region 16 via an optical fiber 18 comprised of a core 20 having a cladding 22. If in accordance with this invention an end of the fiber 18 is cut perpendicularly to its axis and made to bear directly against the passivation layer 14, there is a first interface between the core 20 and air at which light is reflected because of the difference between the index of refraction of the core 20 and air and a second interface between air and the passivation layer 14 at which light is reflected because of the difference between the index of refraction of air and the index of refraction of the passivation layer 14.

In accordance with a preferred form of this invention, these first and second air interfaces are eliminated by inserting a layer 24 of material between the core 20 of the optical fiber 18 and the body 2 of the FET that has an index of refraction matching the index of refraction of the core 20 or the index of refraction of the passivation layer 14 as closely as possible.

If the matching material 24 is a liquid (see FIG. 1A), such as Part No. 42-91 of the General Fiber Optics of Cedar Grove. N.J., some means must be provided for physically holding the optical fiber 18 against the passivation layer 24. For example, a cylinder 26, of such internal diameter is to form a firm fit with the optical fiber 18, may be provided. Note that cylinder 26 can be provided by any suitable insulating material, such as plastic.

If the matching material 24 of FIG. 1A is replaced by an adhesive 24' (as shown on FIG. 1B) such as Part No. 41-48 of the General Fiber Optics Company referred to, it serves the dual purpose of eliminating the reflective air interfaces and attaching the optical fiber 18 to the passivation layer 14. Also, in the alternative embodiment of Fig. 1B the cylinder 26 can be eliminated.

It is important that the layer 24, 24' of material he such as to exclude air from its interface with the core 20 and the passivation layer 14. Thus, if the material 24, 24' has an index of refraction matching the index of the core 20, there is an interface between the material 24, 24' and the passivation layer 14 at which reflections can occur, and if the material 24, 24' has an index of refraction matching the index of the passivation layer 14, there is an interface between the material 24, 24' and the core 20 at which reflections can occur. It is preferable that the match be between the layer 24 or 24' and the core 20.

With the construction just described, the amount of light injected into the active region 16 of the FET is substantially increased because of the extra width of the active region 16 between the source and drain electrodes 8 and 10 and the more efficient coupling between the core 20 and the passivation layer 14 so as to produce a ratio of the lock-in range Δf to the free running frequency of an oscillator using the FET as an active device of 1% or five times as great as that previously attained.

Figure 1B:
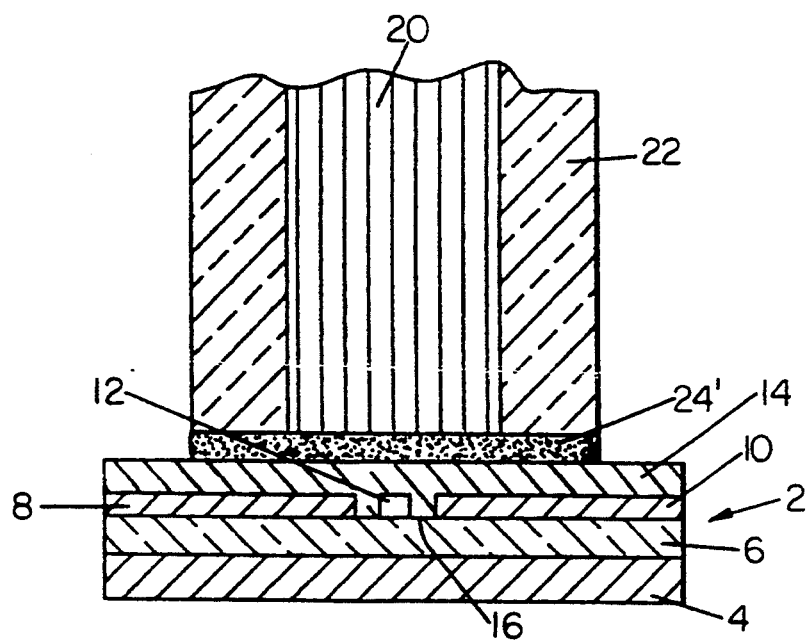
Fig. 1B is a cross section illustrating an alternative embodiment of the invention for the coupling between an optical fiber and the body of a FET via index matching adhesive.

FIG. 2 shows the general arrangement of a system incorporating this invention in which a light source 27 is coupled via an optical fiber 18 to a FET 2 in such manner that there is a layer of matching material like the layer 24 of FIG. 1A, or like the layer 24' of FIG. 1B, between the end of the fiber 18 and the FET 2. The FET 2 is part of a standard circuit 28 such as an oscillator.

FIG. 3 is a view looking down on a portion of the top of the FET 2 in FIG. 2 showing the relative sizes of the active region 16 of the FET 2 lying between its electrodes 8 and 10 and the cross section of the optical fiber 18 when the electrodes 8 and 10 are widely separated e.g. by eight micrometers as in the GTC 213-1.

FIG. 4 is an oblique view of a section 29 of circuit board having a microwave oscillator (not shown) including the FET 2 in which planar microstrips 30, 32 and 34 are respectively bonded by wires 30', 32' and 34' to the pads, not shown, for the source drain and gate electrodes 8, 10 and 12 that are within the FET so as not be seen. A source 36 of light that is amplitude modulated at a frequency somewhere near the free running frequency of the oscillator is coupled via an optical fiber 18 to an area of a FET 2 that is in coincidence or alignment with its active region, not shown. In accordance with the invention, matching material 24, 24' is inserted between the end of the fiber 18 and the body of the FET 2.

Figure 5:
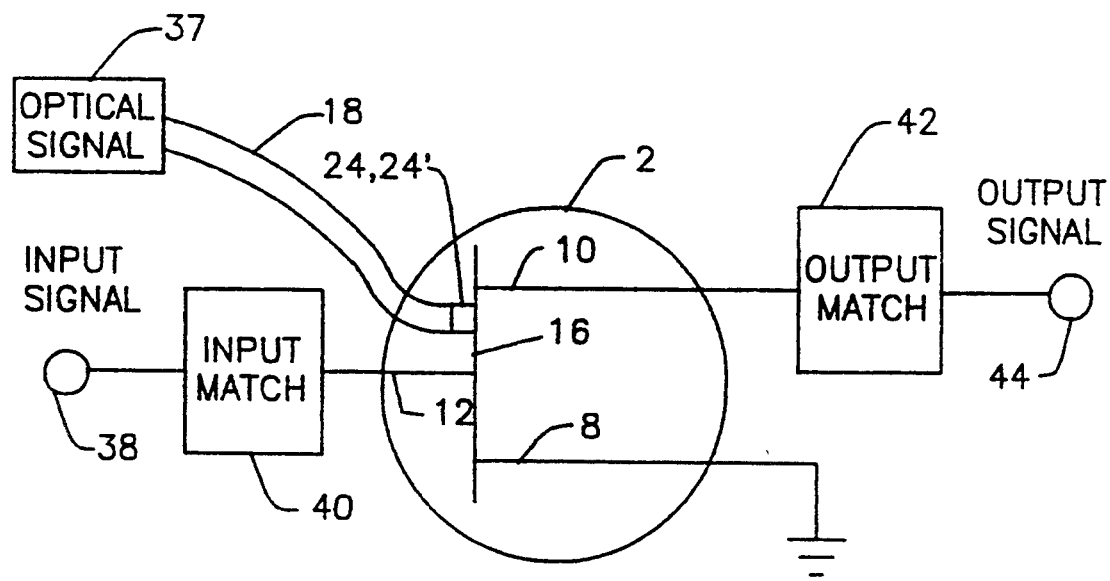
FIG. 5 is a schematic representation of the optical coupling of this invention between a light source and a FET so as to control the gain of the FET for an electrical signal when used as an amplifier.

FIG. 5 is a schematic representation of an application of this invention to a system in which a source 37 of light of variable optical power is coupled via an optical fiber 18 and optical matching material 24, 24' to the active region 16 of a FET 2 so as to control its gain for electrical signals applied to a terminal 38 that is coupled via an electrical input matching means 40 to the gate electrode 12. The source electrode 8 is connected to ground, and the drain electrode 10 is coupled via an electrical matching means 42 to an output terminal 44.

Figure 6:
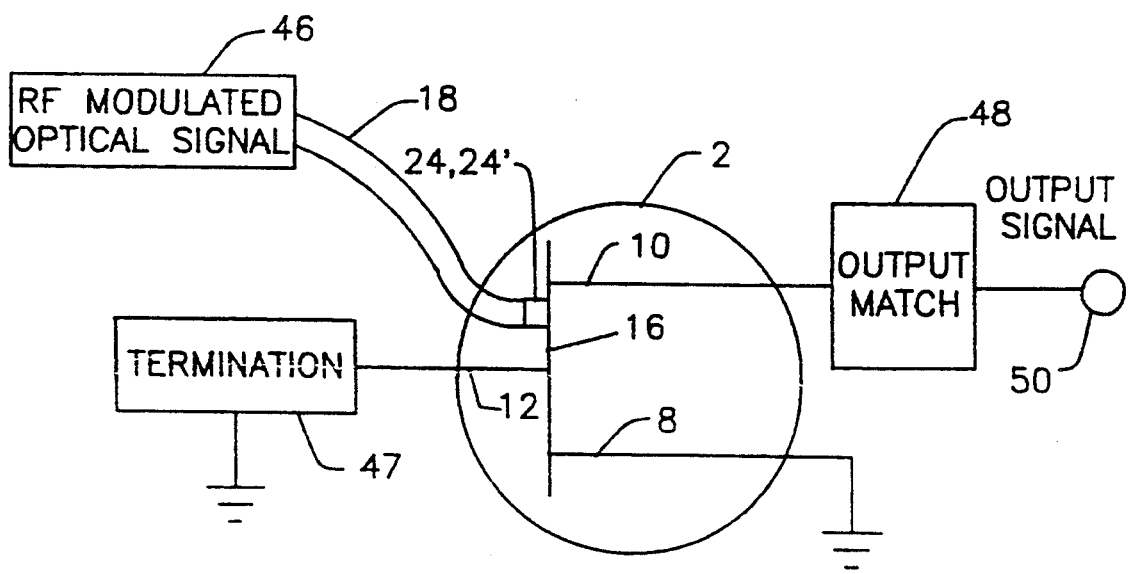
FIG. 6 is a schematic representation of the optical coupling of this invention between an RF modulated light source and a FET that functions as a detector as well as an RF amplifier.

An amplifier for converting an RF amplitude modulated optical signal to an RF electrical signal, shown in FIG. 6, includes a source 46 of an RF modulated optical signal coupled via an optical fiber 18 and a layer of optical matching material 24, 25 to the active region of the FET 2. A termination means 47 is connected between the gate electrode 12 and ground, the source electrode 8 is connected to ground, and an electrical matching means 48 is connected between the drain electrode 10 and an output terminal 50. The RF modulation of the light supplied by the source 46 is detected and amplified by the FET 2 so as to produce an amplified RF electrical wave at the output terminal 50.

Figure 7:
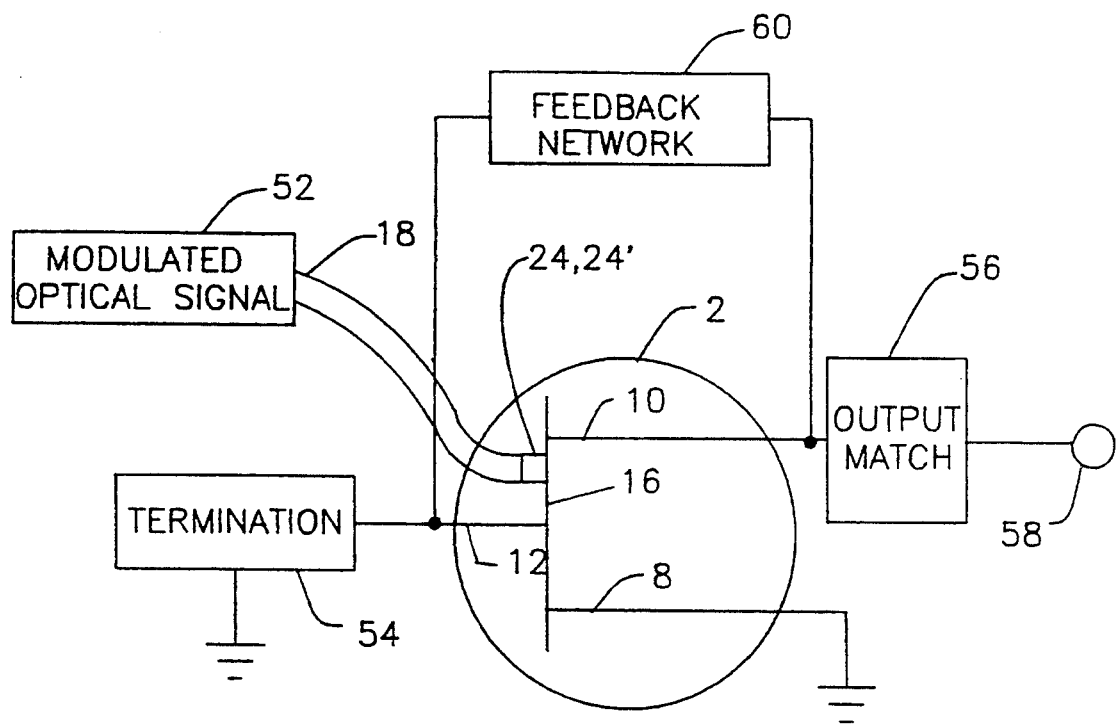
FIG. 7 is a schematic representation of the optical coupling of this invention between a source of a modulated light signal and a parallel feedback oscillator so as to injection lock the oscillator or to provide amplification of a frequency modulated signal.

In FIG. 7, a circuit is schematically presented in which a common source parallel feedback MESFET oscillator is injection locked with light from a source 52 that is amplitude modulated at a frequency close to the free running frequency of the oscillator. Light from the source 52 is coupled via an optical fiber 18 and a matching layer 24, 24' of optical matching material to the active region 16 of the FET 2. A suitable termination impedance 54 is connected between the gate electrode 12 and ground, the source electrode 8 is connected to ground, electrical matching means 56 is connected between the drain electrode 10 and an output terminal 58, and a feedback network 60 is connected between the drain electrode 10 and the gate electrode 12 so as to produce oscillations. If the optical signal from the source 52 is within Δf of the free running frequency of the oscillator circuit just described, the oscillator is locked to it. The circuit serves as an FM amplifier if the optical signals from the source 52 are FM modulated. The coupling of the light source 52 to the active region 16 via the optical fiber 18 and the matching material 24, 24' in accordance with this invention increases the range of frequencies from the source 52 that can lock the oscillator.

Figure 8:
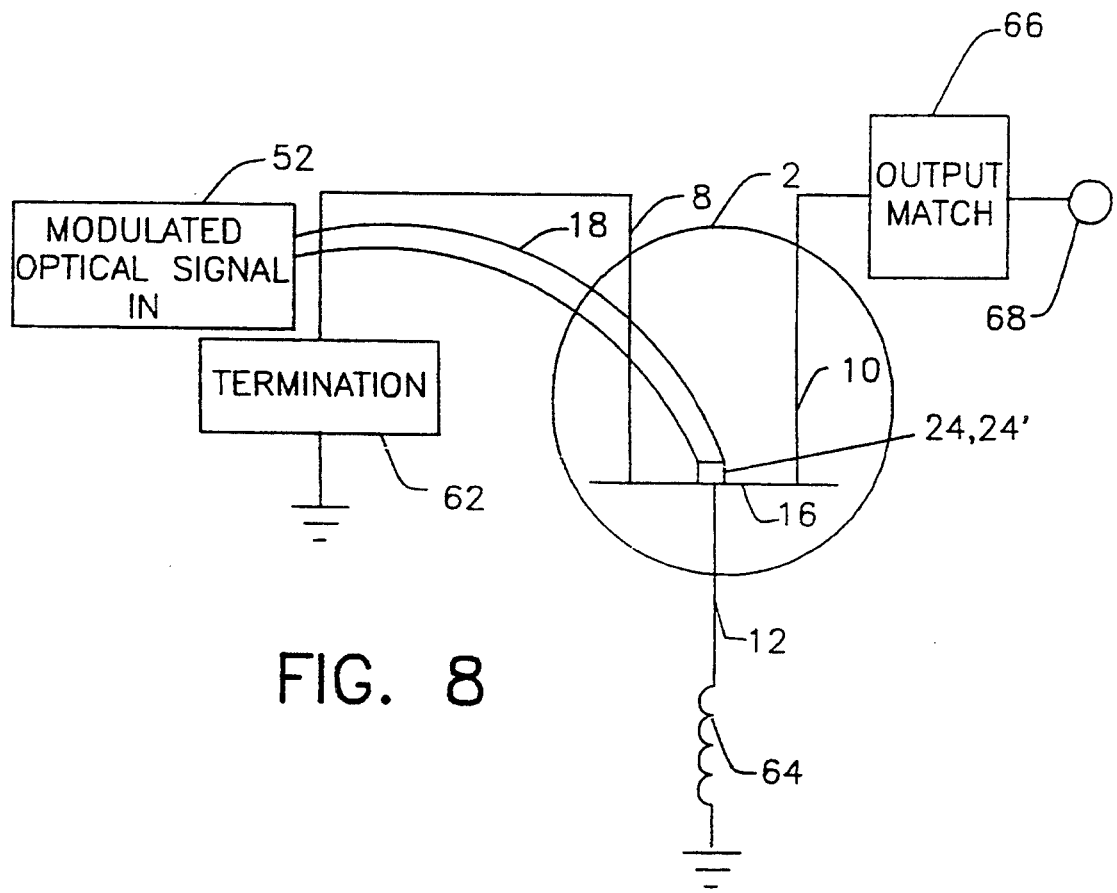
FIG. 8 is a schematic representation of the optical coupling of this invention between a modulated optical signal and a series feedback oscillator so as to injection lock the oscillator or to provide amplification of frequency modulated signal.

A common gate series feedback oscillator circuit using the FET 2 that is injection locked by light coupled to the FET in accordance with this invention is shown in FIG. 8. A terminating network 62 is connected between the source electrode 8 of the FET 2 and ground, an inductor 64 is connected between the gate electrode 12 and ground, and an electrical matching means 66 is connected between the drain electrode 10 and an output terminal 68. A modulated optical signal from a source 52 is coupled via an optical fiber 18 and matching material 24, 24' to the active region 16 in accordance with this invention. As in FIG. 7, the optical signal could be FM modulated so as to produce an amplified electrical FM modulated signal at the output terminal 68.

Although various embodiments of the invention are described herein for purposes of illustration, they are not meant to be limiting. Those of skill in the art may recognize modifications that can be made in the illustrated embodiments. Such modifications are meant to be covered by the spirit and scope of the appended claims.

What is claimed is:

1. An optically responsive device comprising:
    a body containing a photo-semiconductor device having an active, light sensitive area;
    an optical fiber having first and second ends; and
    an index matching material between said first end of said optical fiber and said body so as to optically communicate with the active region thereof, said index matching material being interposed between said optical fiber and said body such as to eliminate air between said optical fiber and said body, the index matching material having an index of refraction matching that of one of said optical fiber and said body.

2. An optically responsive device as set forth in claim 1 wherein the index matching material is a liquid.

3. An optically responsive device as set forth in claim 1 wherein said index matching material is an adhesive.

4. An optically responsive device as set forth in claim 1 wherein the index of refraction of said index matching material matches the index of refraction of said fiber.

5. An optically responsive device as set forth in claim 1 wherein the index of refraction of said index matching material matches the index of refraction of the body.

6. An optically responsive device as set forth in claim 1 wherein the photo-semiconductor device is a field effect transistor having a gate electrode and spaced source and drain electrodes and wherein the spacing between said source and drain electrodes is greater than 7 $\mu$m.

7. An optically responsive device as set forth in claim 6 further comprising:
    means for coupling an electrical signal to be amplified to said gate electrode of said field effect transistor;
    electrical matching means for coupling said drain electrode to an output; and
    means for connecting said source electrode to a point of reference potential;
    whereby, a change in the optical intensity introduced into said second end of said optical fiber varies the electrical gain of said device.

8. An optically responsive device as set forth in claim 6 further comprising:
    a source of reference potential;
    means for connecting said source electrode to said source of reference potential;
    termination means connected between said gate electrode and said source of reference potential;
    electrical matching means coupled to said drain electrode; and
    a source of a radio frequency modulated optical signal coupled to said second end of said optical fiber;
    whereby said device detects said optical signal and produces an amplified RF electrical signal.

9. An optically responsive device as set forth in claim 6 further comprising:
    means coupled to said source drain and gate electrodes of said field effect transistor so as to form an oscillator;
    whereby, said oscillator is locked to a modulation frequency of an optical signal when such is coupled to the second end of said optical fiber.

10. An optically responsive device as set forth in claim 9 wherein said means coupled to said source, drain and gate electrodes forms a parallel feedback oscillator.

* * * * *